United States Patent

Hall et al.

[11] Patent Number: 6,150,992
[45] Date of Patent: Nov. 21, 2000

[54] TRACEABLE SELF-CONTAINED PROGRAMMABLE FREQUENCY SOURCE FOR PERFORMING ALTERNATE TEST SITE AND OPEN AREA TEST SITE COMPARISONS

[75] Inventors: Kenneth E. Hall, Weimar; David Pommerenke, Rocklin, both of Calif.; Lowell Edward Kolb, Loveland, Colo.

[73] Assignee: Hewlett-Packard Company, Palo Alto, Calif.

[21] Appl. No.: 09/149,509

[22] Filed: Sep. 8, 1998

[51] Int. Cl.[7] .................................................... H01Q 3/22
[52] U.S. Cl. ............................................. 343/846; 342/372
[58] Field of Search ...................... 343/846, 848, 343/828, 829, 703; 342/372, 170

[56] References Cited

U.S. PATENT DOCUMENTS

| | | | |
|---|---|---|---|
| 4,521,780 | 6/1985 | Preikschat | 343/17.7 |
| 5,302,960 | 4/1994 | Boers | 342/372 |

FOREIGN PATENT DOCUMENTS

| | | | |
|---|---|---|---|
| 0553738 | 9/1941 | United Kingdom . | |
| 2237165 | 9/1989 | United Kingdom | H04B 1/04 |
| 2237449 | 9/1989 | United Kingdom | H01Q 9/30 |

*Primary Examiner*—Don Wong
*Assistant Examiner*—James Clinger

[57] ABSTRACT

A site reference source acts as a programmable frequency source. The site reference source includes a symmetrical radiating unit. The symmetrical radiating unit includes a cylindrical shaped structure, a signal generator, a power source and an antenna. The signal generator is housed within the cylindrical shaped structure. The power source is also housed within the cylindrical shaped structure. The power source provides power to the signal generator. The antenna is external to the cylindrical shaped structure. The antenna is electrically connected to the signal generator housed within the cylindrical shaped structure. In order to radiate signals, the signal generator generates signals and transmits the signals through the cylindrical shaped structure to the antenna.

15 Claims, 2 Drawing Sheets

TRACEABLE SELF-CONTAINED PROGRAMMABLE FREQUENCY SOURCE FOR PERFORMING ALTERNATE TEST SITE AND OPEN AREA TEST SITE COMPARISONS

BACKGROUND

The present invention concerns electromagnetic compatibility measurements and pertains particularly to traceable, self-contained, programmable frequency source for performing alternate test site and open area test site comparisons.

In order to comply with various regulations and to satisfy performance requirements of consumers, electronic equipment are required to conduct and radiate less than a maximum limit of unwanted electromagnetic energy and are required to have a certain level of immunity against other electromagnetic sources. Measurement methods are supplied in standards such as IEC 1000-4-3, IEC 1000-4-6, ANSI C63.4, CISPR 22.

The coupling of energy to and from a system is not only influenced by the design of the system but also can be affected by the characteristics of the site used to test the equipment.

Over the past 20 years there have been several site sources developed in an attempt to compare electromagnetic interference (EMI) measurement sites, both for radiated EMI signals and for conducted EMI signals. Each of these have one major drawback, the amplitude of the signal output could not be reproduced with any degree of accuracy from unit to unit. Some of the product available could specify +/−0.5 dB unit-to-unit variation if they were built using the same "lot/batches" of components. Once a unit failed the reference was lost. One unit of a reproducible type was developed in 1986 by Hewlett-Packard Company, having a business address of 3000 Hanover Street, Palo Alto, Calif. 94304. However, this unit was lost in transit in 1996.

BRIEF SUMMARY OF THE INVENTION

In accordance with the preferred embodiment of the present invention, a site reference source is set out which acts as a programmable frequency source that uses a symmetrical radiating pattern. The site reference source includes a symmetrical radiating unit. The symmetrical radiating unit includes a cylindrical shaped structure, a signal generator, a power source and an antenna. The signal generator is housed within the cylindrical shaped structure. The power source is also housed within the cylindrical shaped structure. The power source provides power to the signal generator. The antenna is external to the cylindrical shaped structure. The antenna is electrically connected to the signal generator housed within the cylindrical shaped structure. In order to radiate signals, the signal generator generates signals and transmits the signals through the cylindrical shaped structure to the antenna.

In the preferred embodiment, the symmetrical radiating unit additionally includes a fiber optic transceiver. The fiber optic transceiver receives control information from a remote source. For example, the remote source is a computer system connected to an additional fiber optic transceiver. The computer system transmits the control information to the symmetrical radiating unit.

The present invention provides for a superior EMI measurement source that has not been available in the prior art. The described embodiment in this application is unique in that it has an amplitude that can be calibrated from unit to unit to have a variation of less than +/−0.1 dB of the generated signal at each defined frequency, usable from 10 kHz to 4 GHz, and calibration traceable to national and international standards bodies. By selecting the coupling device, for conducted, or antenna (E field or H field), for radiated along with modulation characteristics the detector types (peak, QP and average) and all aspects of emissions can be assessed from 10 kHz to 4 GHz.

Having an accurate amplitude the EMI measurement source can be used to develop a site reference source that can be measured by all internationally recognized standards bodies (NIST, JQL, NPL, Austrian Research Center, BZT, etc.) that have EMI measurement sites. From this data a mean and standard deviation can be developed for each frequency. This can then be applied to other test sites to assess the error of uncertainty of the site as compared to the statistical values for all the international sites.

Using different modulation schemes and random frequency generation the units can be used to assess the performance/proficiency of test sites/personnel for certification by international bodies (NAMAS, NVLAP, BZT, A2LA, DATech, etc.). Other site sources include EMCO Royce Field Source, EMCO/ARC Ref Rad, The University of York CNE and Societe Moderne d'Etudes Electroniques Conducted Emissions Generator and Comb Generator. None of these sources are calibratable.

DETAILED DESCRIPTION OF THE PREFERRED EMBODIMENT

Figure 1:
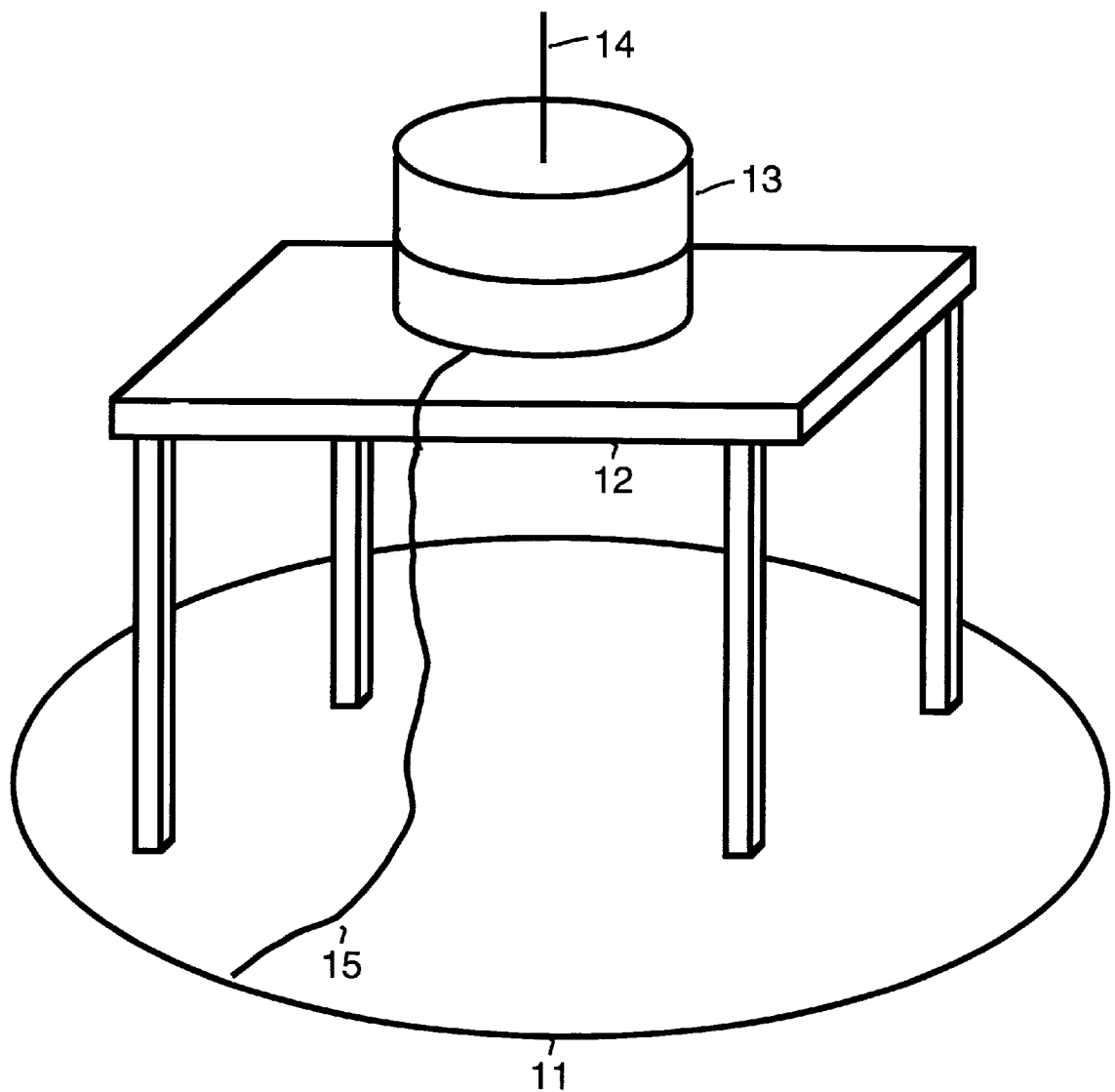
FIG. 1 is a simplified drawing showing a cylindrical shaped structure which houses a signal generator, the cylindrical shaped structure being located on a table within a semi-anechoic chamber in accordance with a preferred embodiment of the present invention.

FIG. 1 shows a cylindrical shaped structure 13 located on a table 12 within a semi-anechoic chamber 10. Alternatively, cylindrical shaped structure 13 may be placed on another supporting structure, or directly on the ground.

Table 12 is placed on a rotating structure 11. A fiber optic cable 15 provides for communication between a signal generator within cylindrical shaped structure 13 and a control system portion of the site reference source (SRS). The control system is located outside semi-anechoic chamber 10.

An antenna 14 is, for example, a 5.25 inch radiating vertical antenna. This allows for provision of a field strength as defined in CISPR 22 ten meters from a receiving antenna.

Cylindrical shaped structure 13 is made as small as possible. In the preferred embodiment, cylindrical shaped structure 13 has a height of 12¾ inches and a diameter of 26¾ inches. Cylindrical shaped structure 13 is composed of quarter inch thick aluminum material.

Cylindrical shaped structure 13 and equipment housed therein act as a radiating unit to provide a symmetrical radiation pattern of RF energy at frequencies of interest in testing. A standard signal generator housed in cylindrical shaped structure 13, has a variation of less than 1.5 dB of the generated signal when measured from a variety of locations within semi-anechoic chamber 10 which are equidistant from the cylindrical shaped structure 13. This compares favorably with a signal from a standard signal generator which varies greater than 20 dB under similar test conditions. The significant reduction in signal power variation achieved by embodiments of the present invention is due to the shape of cylindrical shaped structure 13 and the elimination of external metallic cables.

Unit-to-unit signal generator calibration is achieved using an HP 436 Power Meter available from Hewlett-Packard Company and adjusting the programmed amplitude of signal generator within cylindrical shaped structure 13 to the reference power.

Figure 2:
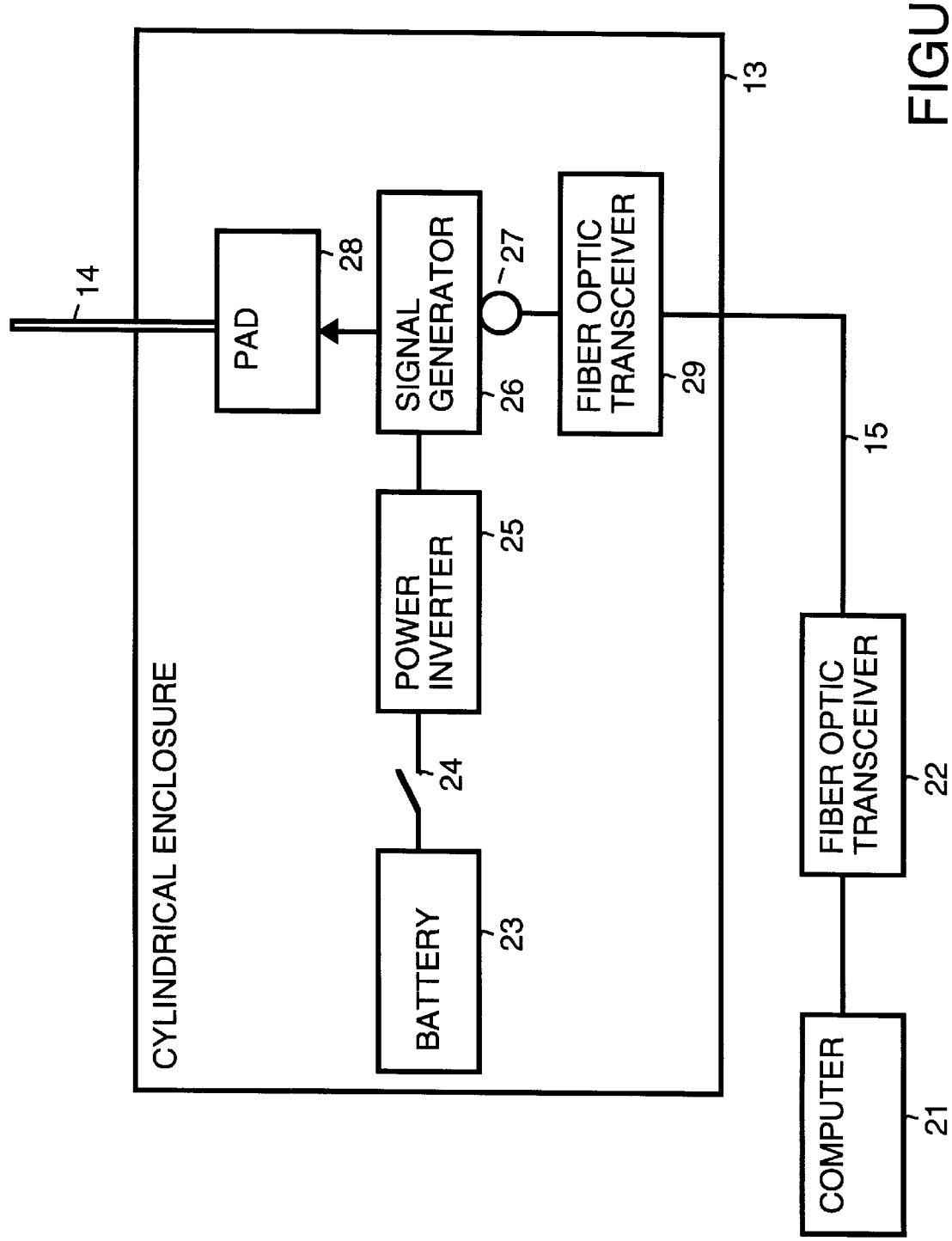
FIG. 2 is a simplified block drawing of a site reference source partially housed by the cylindrical shaped structure shown in FIG. 1 in accordance with a preferred embodiment of the present invention.

FIG. 2 is a simplified block drawing of the entire site reference source (SRS) which is partially housed by cylindrical shaped structure 13.

A computer 21 is used as a control system for the SRS. Computer 21 is, for example, a notebook computer. Computer 21 is connected to fiber cable 15 via a fiber optic transceiver 22. For example, fiber optic transceiver 22 is a TeleByte model number 271FST fiber optic transceiver available from TeleByte Technology, Inc. Alternatively, other non-metallic cabling can be used for the connection. An RS232 connection is used for communication between computer 21 and fiber optic transceiver 22.

In the preferred embodiment of the present invention, computer 21 and fiber optic transceiver 22 remain outside semi-anechoic chamber 10. Fiber cable 15 enters into semi-anechoic chamber 10, passes through cylindrical shaped structure 13 and is connected to a fiber optic transceiver 29. For example, fiber optic transceiver 29 is a TeleByte model number 271FST fiber optic transceiver available from Tele-Byte Technology, Inc.

Fiber cable 15 provides a fiber optic RS232 communication link which allows remote control for the Site Reference Source when computer 21 and cylindrical shaped structure 13 are separated by a distance up to 200 feet. Thus cylindrical shaped structure 13 has no external metallic connections for power or control, which eliminates undesired side lobe radiation caused by metallic cable radiation.

A signal generator 26 is the source of signals generated by the SRS. For example, signal generator 26 is a model number E4433A signal generator available from Hewlett-Packard Company. Signal generator 26 is under the control of computer 21. In the preferred embodiment, a program, written in HP BASIC, running on computer 21 controls the frequency and amplitude of signal generator 26. Signal generator 26 is connected to fiber optic transceiver 29 via an RS-232 cable connected to signal generator 26 via a connector 27. For example, connector 27 is a dual male 9 pin adapter, model number GCU16053 available from Newark Electronics Corporation, having a business address of 4677 Old Ironsides Drive # 160, Santa Clara, Calif. 95054.

Power for signal generator 26 is provided via a battery 23. For example, battery 23 is a model number HP0957-0069, battery available from Hewlett-Packard Company, and modified for 12 volt operation. A switch 24 is used to connect battery 23 to a power inverter 25. For example, power inverter 25 is a portawatt 300 power inverter available from Stat Power, Inc., having a business address of 1755 Redbourne Drive, Atlanta, Ga. 30350.

Antenna 14 is connected to a 6 dB pad 28 within cylindrical shaped structure 13. Signal generator 26 is attached to 6 dB pad 28 via a Semflex 515-sw180-012 connection.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for providing a programmable frequency source, comprising the following steps:
    (a) housing a signal generator and a power source within a cylindrical shaped structure;
    (b) providing an antenna external to the cylindrical shaped structure, the antenna being electrically connected to the signal generator; and,
    (c) using the signal generator as an electromagnetic interference (EMI) measurement source to test the performance of an EMI test site, including the following substeps:
        (c.1) generating signals by the signal generator, and,
        (c.2) transmitting the signals external to the cylindrical shaped structure via the antenna.

2. A method as in claim 1 additionally comprising the following step:
    (d) remotely controlling the signal generator from a computer system which communicates to the signal generator via fiber cable.

3. A method as in claim 1 wherein in step (a) the cylindrical shaped structure is placed within a semi-anechoic chamber.

4. A radiating unit for providing a programmable frequency source comprising:
    a cylindrical shaped structure;
    a signal generator housed within the cylindrical shaped structure;
    a power source housed within the cylindrical shaped structure, the power source providing power to the signal generator; and,
    an antenna external to the cylindrical shaped structure, the antenna being electrically connected to the signal generator housed within the cylindrical shaped structure;
    wherein in order to radiate a signal, the signal generator generates the signal and transmits the signal through the cylindrical shaped structure to the antenna and
    wherein the signal as measured outside the cylindrical shaped structure has an amplitude that is traceable so that the programmable frequency source can be used as an electromagnetic interference (EMI) measurement source to test the performance of an EMI test site.

5. A symmetrical radiating unit as in claim 4 additionally comprising a fiber optic transceiver, coupled to the signal generator, for receiving control information from a remote source.

6. A site reference source for providing a programmable frequency source comprising:
    a radiating unit, the radiating unit comprising:
        a cylindrical shaped structure;
        a signal generator housed within the cylindrical shaped structure;
        a power source housed within the cylindrical shaped structure, the power source providing power to the signal generator; and,
        an antenna external to the cylindrical shaped structure, the antenna being electrically connected to the signal generator housed within the cylindrical shaped structure;
    wherein in order to radiate a signal, the signal generator generates the signal and transmits the signal through the cylindrical shaped structure to the antenna; and
    wherein the signal as measured outside the cylindrical shaped structure has an amplitude that is traceable so that the programmable frequency source can be used as an electromagnetic interference (EMI) measurement source to test the performance of an EMI test site.

7. A site reference source as in claim 6, wherein the symmetrical radiating unit additionally comprises:
   a fiber optic transceiver, coupled to the signal generator, for receiving control information from a remote source.

8. A site reference source as in claim 7, additionally comprising:
   a computer system; and,
   an additional fiber optic transceiver, coupled to the computer system, for transmitting control information to the symmetrical radiating unit.

9. A site reference source as in claim 6, additionally comprising:
   a computer system which is remote from the symmetrical radiating unit and transmits control information to the symmetrical radiating unit.

10. A method as in claim 1 wherein in step (a) the cylindrical shaped structure is metallic.

11. A method as in claim 1 wherein in step (a) the cylindrical shaped structure is composed of aluminum material.

12. A symmetrical radiating unit as in claim 4 wherein the cylindrical shaped structure is metallic.

13. A symmetrical radiating unit as in claim 4 wherein the cylindrical shaped structure is composed of aluminum material.

14. A site reference source as in claim 6 wherein the cylindrical shaped structure is metallic.

15. A site reference source as in claim 6 wherein the cylindrical shaped structure is composed of aluminum material.

* * * * *